United States Patent
Jeong et al.

(10) Patent No.: US 9,986,638 B2
(45) Date of Patent: May 29, 2018

(54) SYNTHETIC METHOD OF SUPPRESSING METAL NANO-PARTICLE FROM HAVING OXIDIZED FILM AND METHOD OF MANUFACTURING CONDUCTIVE METAL THIN FILM VIA SOLUTION-PROCESSED

(71) Applicant: KOREA RESEARCH INSTITUTE OF CHEMICAL TECHNOLOGY, Daejeon (KR)

(72) Inventors: Sun Ho Jeong, Daejeon (KR); Young Min Choi, Daejeon (KR); Beyong Hwang Ryu, Daejeon (KR); Yeong Hui Seo, Gyeonggi-do (KR); Su Hyun Lee, Ghungcheongbuk-do (KR)

(73) Assignee: KOREA RESEARCH INSTITUTE OF CHEMICAL TECHNOLOGY, Daejeon (KR)

( * ) Notice: Subject to any disclaimer, the term of this patent is extended or adjusted under 35 U.S.C. 154(b) by 0 days. days.

(21) Appl. No.: 14/389,574

(22) PCT Filed: Mar. 29, 2013

(86) PCT No.: PCT/KR2013/002606
§ 371 (c)(1),
(2) Date: Sep. 30, 2014

(87) PCT Pub. No.: WO2013/147535
PCT Pub. Date: Oct. 3, 2013

(65) Prior Publication Data
US 2015/0053464 A1 Feb. 26, 2015

(30) Foreign Application Priority Data

| Mar. 30, 2012 | (KR) | 10-2012-0033242 |
| Jun. 18, 2012 | (KR) | 10-2012-0064932 |
| Nov. 28, 2012 | (KR) | 10-2012-0136344 |

(51) Int. Cl.
*H05K 1/00* (2006.01)
*H05K 1/09* (2006.01)
(Continued)

(52) U.S. Cl.
CPC .............. *H05K 1/097* (2013.01); *B05D 3/02* (2013.01); *B05D 3/0254* (2013.01); *B05D 5/12* (2013.01);
(Continued)

(58) Field of Classification Search
USPC ............................................. 427/96.1, 383.1
See application file for complete search history.

(56) References Cited

U.S. PATENT DOCUMENTS

| 7,968,008 B2 * | 6/2011 | Parashar | B22F 1/0018 252/500 |
| 7,988,761 B2 * | 8/2011 | Jun | B22F 1/0025 75/343 |

(Continued)

FOREIGN PATENT DOCUMENTS

| CN | 101495580 A | 7/2009 |
| EP | 2 048 205 A1 | 4/2009 |

(Continued)

OTHER PUBLICATIONS

International Search Report dated Jul. 9, 2013; PCT/KR2013/002606.

(Continued)

*Primary Examiner* — Brian K Talbot
(74) *Attorney, Agent, or Firm* — Ladas & Parry LLP; Loren K. Thompson (57) ABSTRACT

Provided is a method of manufacturing a conductive metal thin film, the method including: a) heating and stirring a first solution containing a metal precursor, acid, amine, and a reducing agent to synthesize metal nano-particles on which
(Continued)

formation of a surface oxide film is suppressed; b) dispersing the metal nano-particles synthesize in step a) in a non-aqueous solvent to prepare a conductive ink composition; c) applying the conductive ink composition onto an insulating substrate; and d) heat-treating the insulating substrate applied with the ink composition to form a conductive metal thin film. With the method of manufacturing a conductive metal thin film according to the present invention, large area conductive thin film may be manufactured as compared with the existing conductive ink composition based on noble metal nano-particles. In addition, the conductive metal thin film having excellent conductivity may be manufactured by suppressing a surface oxide film from being formed.

11 Claims, 6 Drawing Sheets

(51) Int. Cl.
*B05D 3/02* (2006.01)
*B05D 5/12* (2006.01)
*H05K 3/12* (2006.01)

(52) U.S. Cl.
CPC ......... *H05K 3/1275* (2013.01); *H05K 3/1283* (2013.01); *H05K 2203/086* (2013.01)

(56) References Cited

U.S. PATENT DOCUMENTS

| | | | |
|---|---|---|---|
| 2009/0214764 A1* | 8/2009 | Li | B22F 1/0018 427/98.4 |
| 2010/0275729 A1 | 11/2010 | Jun et al. | |
| 2011/0315436 A1* | 12/2011 | Kim | B22F 1/0018 174/257 |
| 2015/0259803 A1* | 9/2015 | Yamasaki | B22F 1/0022 106/1.23 |

FOREIGN PATENT DOCUMENTS

| | | |
|---|---|---|
| EP | 2 380 688 A1 | 10/2011 |
| KR | 1020000018196 A | 4/2000 |
| KR | 1020110101344 A | 9/2011 |

OTHER PUBLICATIONS

Chinese Office Action dated Jun. 3, 2015; Appln. No. 201380017650.0.

* cited by examiner

SYNTHETIC METHOD OF SUPPRESSING METAL NANO-PARTICLE FROM HAVING OXIDIZED FILM AND METHOD OF MANUFACTURING CONDUCTIVE METAL THIN FILM VIA SOLUTION-PROCESSED

TECHNICAL FIELD

The present invention relates to a method of preparing new metal ink capable of suppressing a surface oxide film from being formed on metal nano-particles, and a method of manufacturing a conductive metal thin film using the same. In addition, the present invention relates to a method of manufacturing a conductive metal thin film having excellent conductivity.

Further, the present invention relates to a highly conductive metal nano-ink composition that does not affect conductivity while improving immobilization properties of the metal nano-particles on a substrate, and a conductive metal thin film manufactured therefrom.

BACKGROUND ART

The development of metal ink containing metal nano-particles has advantages in that a metal wiring having a fine pattern may be printed on various substrates without using a complicated process of photolithography, by only a single printing process such as a screen printing process, an inkjet printing process, a gravure offset printing process, a reverse offset printing process, or the like, to thereby simplify the process. In addition, manufacturing cost may be significantly decreased due to simplification of the process, and a high integration and high efficiency printed circuit may be manufactured due to fineness of a wiring width.

Particularly, in the case of a flexible printed circuit board in which a circuit is printed on a resin film, since the flexible board itself may be damaged while being subjected to a complicated series of processes accompanied with lithography, that is, an applying process, a drying process, an exposure process, an etching process, and a removal process, the metal ink containing mono-dispersed nano-particles capable of directly forming a circuit on the resin film has been urgently demanded.

Realistically, it is almost impossible to prepare metal particles having a nano size and oxidation stability using a method of preparing metal nano-particles according to the traditional physical method, and it is more difficult to provide a metal nano-particle dispersion solution having the oxidation stability by dispersing the metal particle in a polar solvent such as deionized water, or the like.

Generally, the metal nano-particle as described above has been synthesized by a wet reducing process, and a property in view of exhibiting conductivity was deteriorated due to a problem in that a surface oxide film is easily formed on the metal particle at the time of the synthesis.

As a method of preparing metal nano-particle having oxidation stability against a polar solvent according to the related art, research into a wet reducing method of preparing the metal nano-particle by reducing metal ions using a reducing agent in the presence of a surfactant solution and anti-oxidant (oxidation preventing agent) has been disclosed in Korean Patent Laid-Open Publication No. 2000-0018196 (Patent Document 1). This method, which is a method of preparing a small reactor having a nano size using a surfactant to adjust a size of the particle in the reactor by reduction reaction by the reducing agent, has advantages in that the size of the particle may be easily adjusted and the particle is stable, but there are problems such as a resistance increase due to the surfactant and the anti-oxidant used in order to secure oxidation stability and dispersion stability at the time of forming the wiring and a metal film, and the like.

In addition, a disadvantage in that a metal oxide film is formed on a surface of the produced nano-particle, which deteriorates physical properties such as conductivity of the metal, and the like, should still be addressed.

Further, a problem in that when the produced nano-particle is firmly immobilized on the substrate, in the case in which a binder is used at the time of forming the wiring and the metal film, the conductivity may not be sufficiently secured due to the resistance increase, which still should be solved.

RELATED ART DOCUMENT

Patent Document (Patent Document 1) Korean Patent Laid-open Publication No. 2000-0018196

DISCLOSURE OF INVENTION

Technical Problem

An object of the present invention is to provide a method of manufacturing a cheap conductive thin film having excellent conductivity by simplifying processes at the time of synthesizing solution processed metal nano-particles, synthesizing the metal nano-particle on which formation of a surface oxide film causing deterioration of conductivity is completely suppressed, and effectively removing capping molecules introduced in order to suppress the formation of the surface oxide film.

Another object of the present invention is to provide ink having improved stability by further decreasing sizes of metal nano-particles, and a conductive metal thin film manufactured using the same.

Another object of the present invention is to provide an ink composition capable of allowing the metal nano-particles to be stably immobilized on a substrate without decreasing conductivity, and a conductive metal thin film manufactured using the same.

Solution to Problem

In one general aspect, a method of preparing a conductive metal ink composition includes: synthesizing metal nano-particles capable of suppressing formation of a surface oxide film and having excellent conductivity; and preparing a conductive ink composition using the metal nano-particles.

In another general aspect, a method of manufacturing a conductive metal thin film includes: synthesizing metal nano-particles on which formation of a surface oxide film is suppressed and of which sizes are further decreased; preparing a conductive ink composition capable of being firmly immobilized on a substrate using the metal nano-particles; applying the ink composition onto an insulating substrate; and heat-treating the substrate applied with the ink composition.

Hereinafter, the method of preparing a conductive ink composition according to the present invention will be described in detail.

First, in the preparing of the ink, a metal nano-ink pre-composition may be prepared by heating and stirring a solution simultaneously containing a metal precursor, an organic acid compound, an organic amine compound, and a reducing agent to prepare a solution containing metal nanoparticles on which the formation of the surface oxide film is suppressed.

In addition, a conductive metal nano-ink composition having more excellent conductivity may be prepared by heating the solution in order to prepare nano-particles under inert atmosphere in the preparing of the metal nano-ink pre-composition. Here, the inert atmosphere means an inert atmosphere generally understood in the art such as a nitrogen atmosphere, an argon atmosphere, or the like, but is not limited thereto.

In addition, according to the present invention, the conductive metal nano-ink composition may be prepared by dispersing the prepared metal nano-ink pre-composition in a non-aqueous solvent.

Further, the present invention provides ink capable of imparting a function of firmly immobilizing the metal nanoparticles on a substrate without damaging conductivity by including compounds having the following structural Formulas at the time of preparing the metal nano-ink pre-composition, and a conductive metal thin film manufactured using the ink. In the present invention, the compound may be injected together with a metal precursor or injected when prepared metal nano-particles to be described below is dispersed in a polar solvent.

[Chemical Formula 1]

(In Chemical Formula 1, x indicates amine (—NH$_2$) or thiol (—SH), R$_1$ indicates (C$_0$-C$_{17}$) alkyl, R$_2$ includes (C$_1$-C$_{17}$) alkyl or (C$_1$-C$_5$) alkoxy, and n is an integer of 1 to 3.

[Chemical Formula 2]

(In Chemical Formula 2, R$_1$ includes CH$_3$, CF$_3$, C$_6$H$_5$, C$_6$H$_4$F, and C$_6$F$_5$, R$_2$ includes (CH$_2$)n, (CF$_2$)n, and (C$_6$H$_4$)n, and n is an integer of 1 to 17.)

Then, the method of manufacturing a conductive metal thin film will be described below.

The present invention provides a method of manufacturing a conductive metal thin film having excellent conductivity, the method including: applying the conductive metal nano-ink composition onto the insulating substrate; and heat-treating the insulating substrate applied with the conductive metal nano-ink composition to form the conductive metal thin film.

In the present invention, the metal precursor is not particularly limited, but one or at least two metal precursors may be selected from a group consisting of metals such as copper, nickel, cobalt, and aluminum, and an alloy thereof. For example, as the metal precursor, one kind or at least two kinds of metal precursors selected from inorganic salts including nitrates, sulfates, acetates, phosphates, silicates, and hydrochlorides of metal components, for example, metals such as copper, nickel, cobalt, and aluminum, the alloy thereof, or the like, may be used.

In the present invention, the organic acid compound is not particularly limited but may be an organic acid compound having at least one shape of a linear shape, a branched shape, or a circular shape in which 6 to 30 carbon atoms are contained and be one or at least two selected from saturated and un-saturated acids. For example, the acid may be one or at least two selected from a group consisting of oleic acid, ricinoleic acid, stearic acid, hydroxy stearic acid, linoleic acid, aminodecanoic acid, hydroxy decanoic acid, lauric acid, decanoic acid, undecanoic acid, hexyldecanoic acid, hydroxy palmitic acid, hydroxy myristic acid, palmitoleic acid, myristoleic acid, and the like, but is not limited thereto.

A content of the organic acid compound is not particularly limited, but a molar ratio of the metal precursor and the organic acid compound may be preferably 1:0.2 to 4.

In the present invention, the organic amine compound may have at least one shape of a linear shape, a branched shape, and a circular shape in which 6 to 30 carbon atoms are contained and be one or at least two selected from saturated and un-saturated amines. Examples of the organic amine compound may include hexyl amine, heptyl amine, octyl amine, dodecyl amine, 2-ethylhexyl amine, 1,3-dimethyl-n-butyl amine, 1-aminotridecane, and the like, but is not limited thereto. A content of the organic amine compound is not particularly limited, but when a molar ratio of the metal precursor and the organic amine compound is 1:0.2 or more, there is no problem in the particle size and stability of the ink. In addition, the organic amine compound may be excessively used. It was found that even though the organic amine compound is excessively used, the organic amine compound may serve as a solvent, such that the compound does not affect the adjustment of the particle size, reduction of the particle, and stability of the ink. For example, the content of the organic amine compound may be 30 moles or more, or 50 moles or more based on 1 mole of the metal precursor, but is not limited thereto.

The reducing agent may be one or at least two selected from hydrazine based reducing agents, hydride based reducing agents, borohydride based reducing agents, sodium phosphate based reducing agents, and ascorbic acid.

More specifically, as the reducing agent, one or at least two hydrazine based reducing agents selected from hydrazine, hydrazine anhydride, hydrazine hydrochloride, hydrazine sulfate, hydrazine hydrate, and phenyl hydrazine may be used.

A content of the reducing agent is not particularly limited as long as the metal precursor may be reduced to the metal particle. For example, when a molar ratio of the reducing agent to the metal precursor is 1 to 100, the objects of the present invention may be achieved.

The reducing agent may be added to a synthetic solution before or after heating and stirring. In the present invention, a heating temperature is not particularly limited as long as the reduction reaction is smoothly carried out. For example, when the heating is performed at 100 to 350° C., preferably 150 to 300° C., conductivity may be improved.

The non-aqueous solvent used to disperse the prepared metal nano-ink pre-composition is not particularly limited. For example, the non-aqueous solvent may be one or at least two selected from a group consisting of alkane having 6 to 30 carbon atoms, amine, toluene, xylene, chloroform, dichloromethane, tetradecane, octadecene, chlorobenzene, dichlorobenzene, chlorobenzoic acid, and dipropylene glycol propyl ether, but is not limited thereto.

Since a use amount of the non-aqueous solvent may be variously adjusted according to viscosity of the ink or applications thereof, the use amount is not particularly limited in the present invention.

In the present invention, even though a clear reason remains unknown, when the metal precursor, the organic acid compound, and the organic amine compound are simultaneously injected, the particle size of the metal precursor is decreased to thereby improve stability of the ink, and formation of the metal oxide film is also suppressed to thereby obtain excellent conductivity, which are unexpected effects. The reason of these effects is not clear but thought that the acid component and the amine component are simultaneously injected, such that they act on a surface of the metal when the metal precursor is reduced to suppress formation of metal oxide. Although these effects were significantly limited in the case in which the acid component and the amine component are injected respectively, in the present invention, the particle size may be significantly decreased by simultaneous injection of the acid component and the amine component.

Further, in the case in which the heating is additionally performed under oxygen-free atmosphere when the metal nano-particles are prepared, an unexpected effect of increasing the conductivity may be achieved. In the case in which the metal nano-particles are prepared under oxygen-free atmosphere as described above, it is possible to suppress even a small amount of metal oxide film from being formed in addition to pre-suppressing the formation of the metal oxide film under oxygen atmosphere such as air by the configuration of the present invention, such that conductivity may be further increased.

The application may be performed by a coating or printing method. The coating method may be selected from a dip coating method, a spin coating method, and a casting method, and the printing method may be selected from an inkjet printing method, an electro-hydrodynamic printing method, a micro contact printing method, an imprinting method, a gravure printing method, a reverse offset printing method, a gravure offset printing method, and a screen printing method.

In the present invention, the heating at the time of heat-treating the applied thin film may be performed under atmosphere selected from air, a non-oxygen gas atmosphere, a hydrazine based gas atmosphere, a reducing atmosphere, and an atmosphere of carboxylic acid containing 1 to 20 carbon atoms.

Further, the conductive ink composition in step b) may contain 1 to 20 parts by weight of the dispersant based on 100 parts by weight of the metal nano-particles.

The dispersant may be one or at least two selected from anionic compounds, non-ionic compounds, cationic compounds, ampholytic compounds, high molecular weight aqueous dispersants, high molecular weight non-aqueous dispersants, high molecular weight cationic dispersants, and the like.

In addition, a conductive metal thin film manufactured by the manufacturing method according to the present invention is also included in the scope of the present invention.

In addition, a flexible printed circuit board including the conductive metal thin film is also included in the scope of the present invention.

Advantageous Effects of Invention

According to the present invention, since a conductive metal thin film is manufactured by simultaneously injecting a metal precursor, an organic acid compound, and an organic amine compound to induce reduction by a reducing agent, a process may be simplified and efficient.

According to the present invention, since formation of a metal oxide film on surfaces of metal nano-particles may be suppressed at the time of synthesizing the metal nano-particles, high conductivity may be obtained. That is, according to the present invention, since the surface oxide film degrading characteristics in view of conductivity in addition to decreasing process efficiency may be suppressed at the time of synthesizing the nano-particles, the nano-particles may have excellent conductivity.

Further, additionally, in the case in which the metal nano-particles are prepared under oxygen-free atmosphere, the metal nano-particles having more excellent conductivity may be prepared.

In addition, according to the present invention, the nano-particles having a fine size may be prepared, such that stability of ink may be achieved.

Further, according to the present invention, since a low cost large area conductive thin film may be manufactured without using an existing conductive ink based on noble metal nano-particles, the practical uses thereof will be enlarged.

BEST MODE FOR CARRYING OUT THE INVENTION

Hereinafter, embodiments of the present invention will be described in detail.

In one general aspect, there is provided a method of preparing a conductive ink composition including: synthesizing metal nano-particles on which formation of a surface oxide film is suppressed; and preparing a conductive ink composition using the metal nano-particles.

In another general aspect, there is provided a method of preparing a conductive ink composition including: synthesizing metal nano-particles on which formation of a surface oxide film is suppressed by heating to reduce raw materials under inert atmosphere; and preparing a conductive ink composition using the metal nano-particles.

In another general aspect, there is provided a highly conductive metal nano-ink composition in which formation of a surface oxide film is suppressed by simultaneously injecting a metal precursor, an organic acid compound, and an organic amine compound to allow the metal precursor to be reduced by a reducing agent.

In another general aspect, there is provided a highly conductive metal nano-ink composition having further improved conductivity by simultaneously injecting a metal precursor, an organic acid compound, and an organic amine compound and heating them at an inert atmosphere at the time of allowing the metal precursor to be reduced by a reducing agent.

In another general aspect, there are provided ink capable of imparting a function of firmly fixing metal nano-particles on a substrate without damaging conductivity by individually using or mixing compounds having the following structural Formula at the time of preparing the metal nano-ink composition as described above, and a conductive metal thin film manufactured using the ink. In the present invention, the compound may be injected together with a metal precursor or injected when prepared metal nano-particles to be described below is dispersed in a non-aqueous solvent. In the present invention, the compound may be mixed at a content of 0.001 to 1 parts by weight, preferably 0.01 to 0.3 parts by weight based on 100 parts by weight of the metal precursor.

[Chemical Formula 1]

(In Chemical Formula 1, x indicates amine (—$NH_2$) or thiol (—SH), $R_1$ indicates ($C_0$-$C_{17}$) alkyl, $R_2$ includes ($C_1$-$C_{17}$) alkyl or ($C_1$-$C_5$) alkoxy, and n is an integer of 1 to 3.

[Chemical Formula 2]

(In Chemical Formula 2, $R_1$ includes $CH_3$, $CF_3$, $C_6H_5$, $C_6H_4F$, and $C_6F_5$, $R_2$ includes $(CH_2)n$, $(CF_2)n$, and $(C_6H_4)n$, and n is an integer of 1 to 17.)

The method for preparing a metal nano-ink composition according to the present invention may further include, in the preparing of the conductive nano-ink composition, dispersing a prepared metal nano-particle solution in a non-aqueous solvent.

In addition, in another general aspect, there is provided a method of manufacturing a conductive metal thin film, the method including: applying the highly conductive metal nano-ink composition dispersed in the non-aqueous solvent on a substrate.

Further, in another general aspect, there is provided a method of manufacturing a conductive metal thin film, the method including: applying the highly conductive metal nano-ink composition on a substrate and then heat-treating the substrate.

More specifically, the method of preparing a highly conductive nano-ink composition according to an exemplary embodiment of the present invention includes:

a) heating and stirring a solution containing a metal precursor, an organic acid compound, an organic amine compound, and a reducing agent to synthesize metal nano-particles on which formation of a surface oxide film is suppressed; and b) dispersing the metal nano-particles synthesized in step a) in a non-aqueous solvent to prepare a conductive ink composition.

Further, in step a), the heating may be performed under inert atmosphere.

In addition, the method of manufacturing a conductive metal thin film according to another exemplary embodiment of the present invention includes:

a) heating and stirring a solution containing a metal precursor, an organic acid compound, an organic amine compound, and a reducing agent to synthesize metal nano-particles on which formation of a surface oxide film is suppressed;

b) dispersing the metal nano-particles synthesized in step a) in a non-aqueous solvent to prepare a conductive ink composition;

c) applying the conductive ink composition onto an insulating substrate; and d) heat-treating the insulating substrate applied with the ink composition to form a conductive metal thin film.

Further, the method of manufacturing a conductive metal thin film according to another exemplary embodiment of the present invention includes:

a) heating and stirring a solution containing a metal precursor, an organic acid compound, an organic amine compound, and a reducing agent in an inert atmosphere to synthesize metal nano-particles on which formation of a surface oxide film is suppressed;

b) dispersing the metal nano-particles synthesized in step a) in a non-aqueous solvent to prepare a conductive ink composition;

c) applying the conductive ink composition onto an insulating substrate; and d) heat-treating the insulating substrate applied with the ink composition to form a conductive metal thin film.

Hereinafter, the method of preparing a highly conductive metal ink composition and the method of manufacturing a conductive metal thin film according to the present invention will be described in detail.

Step a), which is a step of synthesizing the metal nano-particles, is a step of heating and stirring the solution containing the metal precursor, acid, amine, and the reducing agent to synthesize the metal nano-particles on which formation of the surface oxide film is suppressed. In step a), metal ions of the metal precursor are reduced, thereby forming the metal nano-particles. In this case, metal nano-particles having a capsule shape in which surfaces thereof are capped with the acid and amine are formed, thereby making it possible to block the metal nano-particles from being modified into metal oxides even in the case in which the metal nano-particles are kept in the air.

According to the present invention, the reducing agent is injected, such that a reduction reaction at 100° C. or more may be carried out. Unlike the present invention, in the case in which the solution does not simultaneously contain organic acid compound or the organic amine compound, the metal oxide is formed on the surface thereof, such that conductivity may be necessarily deteriorated. However, according to the present invention, this problem may be solved.

Further, in the present invention, it may be appreciated that when the metal nano-particles are heated and reduced under inert atmosphere, the metal particles having excellent conductivity may be obtained.

In step a), the metal precursor may be one or at least two selected from a group consisting of copper, nickel, cobalt, aluminum, and an alloy thereof.

More specifically, the metal precursor may be at least one kind selected from inorganic salts including nitrate, sulfate, acetate, phosphate, silicate, and hydrochloride of the metal selected from the group consisting of copper, nickel, cobalt, aluminum, and an alloy thereof.

In step a), the acid may have at least one shape of a linear shape, a branched shape, and a circular shape in which 6 to 30 carbon atoms are contained and be one or at least two selected from saturated and un-saturated acids.

More specifically, the acid may be one or at least two selected from a group consisting of oleic acid, ricinoleic acid, stearic acid, hydroxy stearic acid, linoleic acid, aminodecanoic acid, hydroxy decanoic acid, lauric acid, decanoic acid, undecanoic acid, hexyldecanoic acid, hydroxy palmitic acid, hydroxy myristic acid, palmitoleic acid, myristoleic acid, and the like, but is not limited thereto.

In the conductive metal thin film according to the present invention, a molar ratio of the metal precursor to the acid is 1:0.2 to 4.

When the molar ratio of the acid to the precursor is less than 0.2, the capping may not perfectly performed, such that the metal that is not capped may be partially oxidized, and when the molar ratio is more than 4, all of the capping materials may not be reacted but coagulated with each other, such that it is impossible to obtain the capped particles.

In step a), the amine may have at least one shape of a linear shape, a branched shape, and a circular shape in which 6 to 30 carbon atoms are contained and be one or at least two selected from saturated and un-saturated amines.

More specifically, the amine may be selected from hexyl amine, heptyl amine, octyl amine, dodecyl amine, 2-ethylhexyl amine, 1,3-dimethyl-n-butyl amine, 1-aminotridecane, and the like, but is not limited thereto. A content of the amine may be 0.2 moles or more, preferably 1 to 50 moles, more preferably 5 to 50 moles based on 1 mole of the metal precursor, and the maximum content is not particularly limited since the organic amine compound may act as a non-aqueous solvent.

In step a), the hydrazine based reducing agent may be one or at least two selected from hydrazine, hydrazine anhydride, hydrazine hydrochloride, hydrazine sulfate, hydrazine hydrate, and phenyl hydrazine. In addition, as the reducing agent, one or at least two of hydrides; borohydrides such as tetrabutyl ammonium borohydride, tetramethyl ammonium borohydride, tetraethyl ammonium borohydride, sodium borohydride, and the like; sodium phosphates; and ascorbic acid may be selected and used. Among them, the hydrazine based reducing agent is most preferable due to strong reducing power.

In step a), the synthesizing of the metal nano-particles is not particularly limited but may be performed at 100 to 350° C., more preferably 140 to 300° C., most preferably 150 to 250° C. in consideration of efficiency of the reduction.

According to the present invention, the reduction reaction may be carried out at 100° C. or more.

Further, since the reduction reaction may be carried out at a high temperature of 100° C. or more, a synthesis rate and yield of the metal nano-particles may be increased. In addition, the hydrazine based reducing agent generally has excellent reducing power, such that the hydrazine based reducing agent may be preferably used due to excellent reducing power as compared with other reducing agents.

A composition rate of a first solution at the time of synthesis of the metal nano-particles in step a) will be described in detail. The composition ratio is not particularly limited, but it is preferable that a content of acid is 0.2 to 4 moles, and a content of amine is 0.2 moles or more, preferably 0.2 to 50 moles, more preferable 5 to 20 moles based on 1 mole of the metal precursor, in consideration of capping efficiency of the metal nano-particles.

The reducing agent may be contained so that a molar ratio of the reducing agent to the metal precursor is 1 to 100. In the case in which the molar ratio is less than 1, the metal ions of the metal precursor may not be partially reduced, and in the case in which the molar ratio is more than 100, the reducing agent in excess does not affect a reduction rate, such that the excessive reducing agent is not preferable in view of efficiency.

As described above, only the metal nano-particles may be obtained from the solution containing the metal nano-particles in step a) by a separation method such as a method of washing and recovering the metal nano-particles using centrifugation, or the like.

The conductive metal ink according to the present invention may be obtained by the simple process of simultaneously injecting the metal precursor, the organic acid compound, organic amine compound, and the reducing agent to react with each other. In addition, the metal (copper) nano-particles on which formation of the surface oxide film is completely suppressed may be synthesized by a technology of suppressing the generation of the oxide film generated when the metal nano-particles are capped with only amine or only organic acid.

In this case, the reducing agent may be partially injected in advance at the time of the synthesis of the metal nano-particles according to the present invention to promote the reduction of the metal ion of the metal precursor. In this case, particularly, since the hydrazine based reducing agent may be present in the solution before the reaction to remove oxygen generating oxidation of the metal nano-particles, the formation of the surface oxide film may be further suppressed.

Further, when the heating is additionally performed under inert atmosphere in step a) in which the metal nano-particles are prepared, an unexpected effect of increasing the conductivity may be achieved. In the case in which the metal nano-particles are prepared under inert atmosphere as described above, it is possible to suppress even a small amount of the metal oxide film from being formed in addition to pre-suppressing the formation of the metal oxide film under oxygen atmosphere by the configuration of the present invention, such that conductivity may be further increased.

Next, step b) will be described.

Step b) is a step of preparing the conductive ink composition using the metal nano-particles prepared in step a) and the non-aqueous solvent.

In this case, the non-aqueous solvent is not particularly limited but may be preferably one or at least two selected from a group consisting of alkane having 6 to 30 carbon atoms, amine, toluene, xylene, chloroform, dichloromethane, tetradecane, octadecene, chlorobenzene, dichlorobenzene, chlorobenzoic acid, and dipropylene glycol propyl ether. The conductivity ink composition is not particularly limited but may be prepared by dispersing the metal nano-particles using a method such as stirring, milling, or the like.

In addition, in the conductive ink composition, as needed, a dispersant may be used.

As the dispersant, one or at least two selected from low molecular weight anionic compounds such as fatty acid salts (soap), α-sulfofatty acid ester salts (MES), alkyl benzene sulfonate (ABS), linear alkyl benzene sulfonate (LAS), alkyl sulfonate (AS), alkyl ether sulfonate ester salts (AES), alkyl sulfonate triethanol, and the like; low molecular weight non-ionic compounds such as fatty acid ethanol amide, poly-oxyalkylenealkylether (AE), polyoxyalkylenealkylphenylether (APE), sorbitol, sorbitan, and the like; lower molecular weight cationic compounds such as alkyltrimethyl ammonium salts, dialkyldimethylammonium chloride, and alkylpyridinium chloride, and the like; low molecular weight ampholytic compounds such as alkylcarboxybetaine, sulfobetaine, lecithin, and the like; high molecular weight aqueous dispersants such as a condensate of naphthalene sulfonate with formalin, polystyrene sulfonate, polyacrylate, copolymer salts of vinyl compounds and carboxylic monomer, carboxymethylcellulose, polyvinylalcohol, and the like; high molecular weight non-aqueous dispersants such as partial alkyl ester of polyacryliate, polyalkylenepolyamine, and the like; and high molecular cationic dispersants such as copolymers of polyethyleneimine and aminoalkylmethacrylate, and the like, may be used.

More specifically, examples of the dispersant may include EFKA4008, EFKA4009, EFKA4010, EFKA4015, EFKA4046, EFKA4047, EFKA4060, EFKA4080, EFKA7462, EFKA4020, EFKA4050, EFKA4055, EFKA4400, EFKA4401, EFKA4402, EFKA4403, EFKA4300, EFKA4330, EFKA4340, EFKA6220, EFKA6225, EFKA6700, EFKA6780, EFKA6782, and EFKA8503 (manufactured by EFKA ADDITIVES B. V.), TEXAPHOR-UV21 and TEXAPHOR-UV61 (manufactured by Cognis Japan Ltd.), DisperBYK101, DisperBYK102, DisperBYK106, DisperBYK108, DisperBYK111, DisperBYK116, DisperBYK130, DisperBYK140, DisperBYK142, DisperBYK145, DisperBYK161, DisperBYK162, DisperBYK163, DisperBYK164, DisperBYK166, DisperBYK167, DisperBYK168, DisperBYK170, DisperBYK171, DisperBYK174, DisperBYK180, DisperBYK182, DisperBYK192, DisperBYK193, DisperBYK2000, DisperBYK2001, DisperBYK2020, DisperBYK2025, DisperBYK2050, DisperBYK2070, DisperBYK2155, DisperBYK2164, BYK220S, BYK300, BYK306, BYK320, BYK322, BYK325, BYK330, BYK340, BYK350, BYK377, BYK378, BYK380N, BYK410, BYK425, and BYK430 (manufactured by Bigchemi Japan Co., Ltd.), FTX-207S, FTX-212P, FTX-220P, FTX-220S, FTX-228P, FTX-710LL, FTX-750LL, Ftergent212P, Ftergent220P, Ftergent222F, Ftergent228P, Ftergent245F, Ftergent245P, Ftergent250, Ftergent251, Ftergent710FM, Ftergent730FM, Ftergent730LL, Ftergent730LS, Ftergent750DM, and Ftergent750FM (manufactured by Neos Co., Ltd.), MEGAFACE F-477, MEGAFACE 480SF, and MEGAFACE F-482 (manufactured by DIC Corp.), and the like, but the present invention is not limited thereto.

In addition, the dispersant may be used at a content of 1 to 20 parts by weight based on 100 parts by weight of the metal nano-particles. In the case in which the content of the dispersant is in the above-mentioned range, an effect of decreasing conductivity may be prevented in addition to a sufficient dispersion effect.

Next, step c) will be described.

Step c) is a step of applying the conductive ink composition prepared in step b) onto the insulating substrate.

The application in step c) may be performed by a coating or printing method. The coating method may be selected from a dip coating method, a spin coating method, and a casting method, and the printing method may be selected from an inkjet printing method, an electro-hydrodynamic printing method, a micro contact printing method, an imprinting method, a gravure printing method, a reverse offset printing method, a gravure offset printing method, and a screen printing method.

A coating thickness is not particularly limited, but may be preferably 0.1 to 50 μm after the heat-treatment.

In addition, the substrate in the present invention may be made of glass, polyimide, polyethylene terephthalate, polysulfone, polyethylene naphthalate, polycarbonate, or the like, but is not limited thereto. In the present invention, in the case in which the compound of Chemical Formula 1 or 2 is used as a compound for firmly fixing the ink composition on the substrate, the effect of fixing the ink composition to the substrate may be significantly increased.

Finally, step d) will be described.

Step d) is a step of heat-treating the insulating substrate applied with the ink composition to form the conductive metal thin film. In this case, the conductive metal thin film in which the material capped on the metal nano-particles is removed is formed according to the heat-treatment gas atmosphere and temperature.

Here, the heat-treatment temperature is not particularly limited, but may be 150 to 350° C.

The heat-treatment in step d) may be performed under atmosphere selected from an inert gas atmosphere, a hydrazine based gas atmosphere, a hydrogen atmosphere, and an atmosphere of carboxylic acid containing 1 to 20 carbon atoms. Particularly, even though the clear reason remains unknown, when the heat treatment is performed under hydrogen atmosphere, the thin film having sufficient conductivity may be obtained within a short time.

The conductive metal thin film manufactured by the above-mentioned manufacturing method is included in the scope of the present invention.

In addition, a flexible printed circuit board including the conductive metal thin film is also included in the scope of the present invention.

Hereinafter, Examples will be provided in order to describe the present invention in more detail. However, the present invention is not limited to the following Examples.

Example 1

73.63 g of octylamine, 3.52 g of oleic acid, 87.4 g of phenylhydrazine, and 10.38 g of copper acetate were mixed, thereby preparing a synthetic solution. A molar ratio of oleic acid to copper acetate was 0.2. After forming an inert gas atmosphere using nitrogen gas, the temperature was raised to 150° C., which is a synthetic temperature, to induce a reduction reaction of copper ions, thereby synthesizing copper nano-particles. The synthesized copper nano-particles were washed and recovered using a centrifugation method, and then finally obtained copper nano-particles were dispersed in toluene, thereby preparing a conductive ink composition. As a result of analyzing X-ray diffraction (XRD), it was confirmed that copper oxide was not present in the obtained copper nano-particles. 20 parts by weight of the copper nano-particles and 1 part by weight of a high molecular weight non-aqueous dispersant (DisperBYK 130) were added to 100 parts by weight of toluene, and then a conductive copper ink composition having a uniform disperse phase was prepared by ball-milling and ultrasonic irradiation. The prepared ink composition was coated on an insulating substrate using a casting method so as to have a thickness of 2 μm after heat-treatment, and heat-treatment was performed thereon at 250° C. under Ar atmosphere, thereby manufacturing a conductive thin film.

Whether or not a surface oxide film is present on the conductive thin film manufactured as described above and conductivity of the conductive thin film were measured, and the results were shown in Table 1.

Example 2

73.63 g of octylamine, 17.58 g of oleic acid, 87.4 g of phenylhydrazine, and 10.38 g of copper acetate were mixed, thereby preparing a synthetic solution. A molar ratio of oleic acid to copper acetate was 1. After forming an inert gas atmosphere using nitrogen gas, the temperature was raised to 150° C., which is a synthetic temperature, to induce a reduction reaction of copper ions, thereby synthesizing copper nano-particles. The synthesized copper nano-particles were washed and recovered using a centrifugation method, and then finally obtained copper nano-particles were dispersed in toluene, thereby preparing a conductive ink composition. 20 parts by weight of the copper nano-particles and 1 part by weight of a high molecular weight non-aqueous dispersant (DisperBYK 130) were added to 100 parts by weight of toluene, and then a conductive copper ink composition having a uniform disperse phase was prepared by ball-milling and ultrasonic irradiation. The prepared ink composition was coated on an insulating substrate using a casting method so as to have a thickness of 2 μm after heat-treatment, and heat-treatment was performed thereon at 250° C. under Ar atmosphere, thereby manufacturing a conductive thin film.

Whether or not a surface oxide film is present on the conductive thin film manufactured as described above and conductivity of the conductive thin film were measured, and the results were shown in Table 1.

Example 3

73.63 g of octylamine, 25.1 g of oleic acid, 87.4 g of phenylhydrazine, and 10.38 g of copper acetate were mixed, thereby preparing a synthetic solution. A molar ratio of oleic acid to copper acetate was 1.42. After forming an inert gas atmosphere using nitrogen gas, the temperature was raised to 150° C., which is a synthetic temperature, to induce a reduction reaction of copper ions, thereby synthesizing copper nano-particles. The synthesized copper nano-particles were washed and recovered using a centrifugation method, and then finally obtained copper nano-particles having a size of 80 nm was dispersed in toluene, thereby preparing a conductive ink composition. 20 parts by weight of the copper nano-particles and 1 part by weight of a high molecular weight non-aqueous dispersant (DisperBYK 130) were added to 100 parts by weight of toluene, and then a conductive copper ink composition having a uniform disperse phase was prepared by ball-milling and ultrasonic irradiation. The prepared ink composition was coated on an insulating substrate using a casting method so as to have a thickness of 2 μm after heat-treatment, and heat-treatment was performed thereon at 250° C. under Ar atmosphere, thereby manufacturing a conductive thin film.

Figure 1:
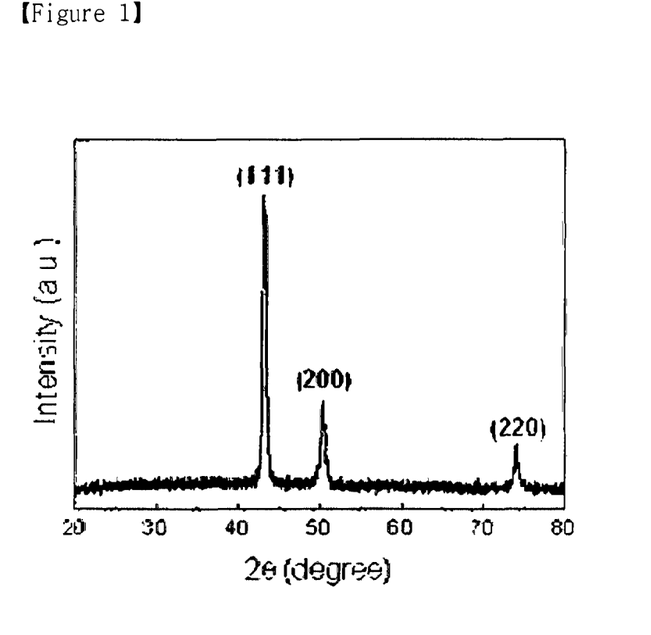
FIG. 1 is a graph showing results obtained by X-ray diffraction (XRD) analysis of a copper nano-particle prepared in Example 3.
Figure 2:
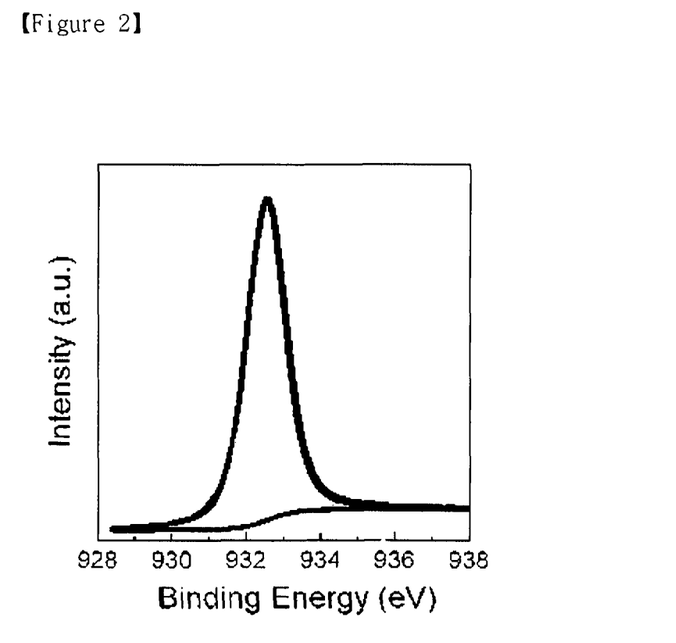
FIG. 2 is a graph showing results obtained by X-ray photoelectron spectroscopy (XPS) analysis of the copper nano-particle prepared in Example 3.
Figure 4:
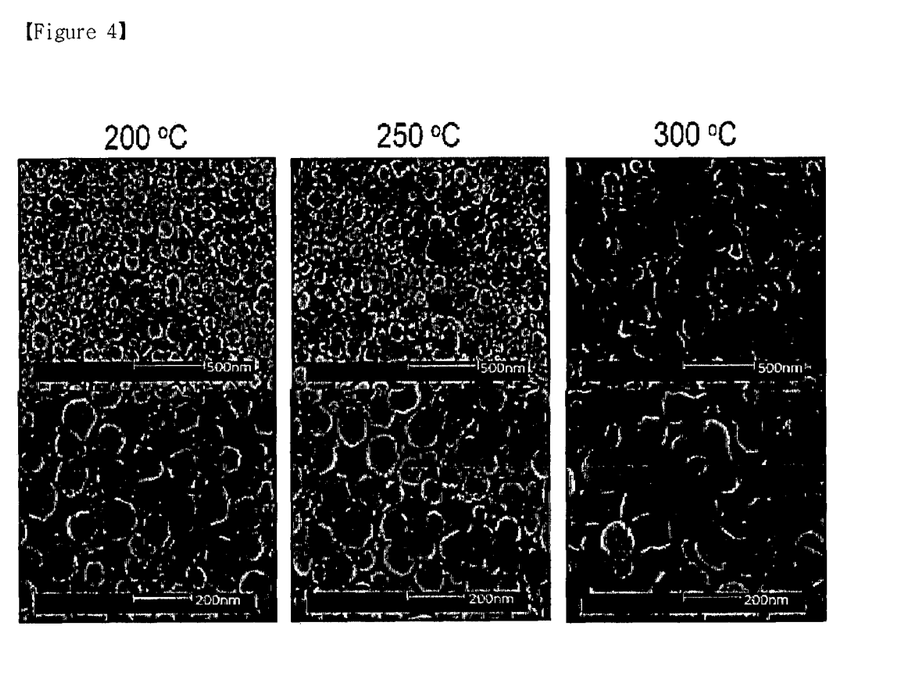
FIG. 4 is a scanning electron microscope (SEM) image of the conductive thin film manufactured in Example 3 according to the heat treatment temperature under inert gas atmosphere.

Whether or not a surface oxide film is present on the conductive thin film manufactured as described above and conductivity of the conductive thin film were measured, and the results were shown in Table 1 and FIGS. 1, 2, and 4.

Example 4

73.63 g of octylamine, 70.3 g of oleic acid, 87.4 g of phenylhydrazine, and 10.38 g of copper acetate were mixed, thereby preparing a synthetic solution. A molar ratio of oleic acid to copper acetate was 4. After forming an inert gas atmosphere using nitrogen gas, the temperature was raised to 150° C., which is a synthetic temperature, to induce a reduction reaction of copper ions, thereby synthesizing copper nano-particles. The synthesized copper nano-particles were washed and recovered using a centrifugation method, and then finally obtained copper nano-particles were dispersed in toluene, thereby preparing a conductive ink composition. 20 parts by weight of the copper nano-particles and 1 part by weight of a high molecular weight non-aqueous dispersant (DisperBYK 130) were added to 100 parts by weight of toluene, and then a conductive copper ink composition having a uniform disperse phase was prepared by ball-milling and ultrasonic irradiation. The prepared ink composition was coated on an insulating substrate using a casting method so as to have a thickness of 2 μm after heat-treatment, and heat-treatment was performed thereon at 250° C. under Ar atmosphere, thereby manufacturing a conductive thin film.

Whether or not a surface oxide film is present on the conductive thin film manufactured as described above and conductivity of the manufactured conductive thin film were measured, and the results were shown in Table 1.

Example 5

73.63 g of octylamine, 3.52 g of oleic acid, 87.4 g of phenylhydrazine, and 10.38 g of copper acetate were mixed, thereby preparing a synthetic solution. A molar ratio of oleic acid to copper acetate was 0.2. After forming an inert gas atmosphere using nitrogen gas, the temperature was raised to 150° C., which is a synthetic temperature, to induce a reduction reaction of copper ions, thereby synthesizing copper nano-particles. The synthesized copper nano-particles were washed and recovered using a centrifugation method, and then finally obtained copper nano-particles were dispersed in toluene, thereby preparing a conductive ink composition. 20 parts by weight of the copper nano-particles and 1 part by weight of a high molecular weight non-aqueous dispersant (DisperBYK 130) were added to 100 parts by weight of toluene, and then a conductive copper ink composition having a uniform disperse phase was prepared by ball-milling and ultrasonic irradiation. The prepared ink composition was coated on an insulating substrate using a casting method so as to have a thickness of 2 μm after heat-treatment, and heat-treatment was performed thereon at 250° C. under 5% $H_2$ atmosphere, thereby manufacturing a conductive thin film.

Whether or not a surface oxide film is present on the conductive thin film manufactured as described above and conductivity of the manufactured conductive thin film were measured, and the results were shown in Table 2.

Example 6

73.63 g of octylamine, 17.58 g of oleic acid, 87.4 g of phenylhydrazine, and 10.38 g of copper acetate were mixed, thereby preparing a synthetic solution. A molar ratio of oleic acid to copper acetate was 1. After forming an inert gas atmosphere using nitrogen gas, the temperature was raised to 150° C., which is a synthetic temperature, to induce a reduction reaction of copper ions, thereby synthesizing copper nano-particles. The synthesized copper nano-particles were washed and recovered using a centrifugation method, and then finally obtained copper nano-particles were dispersed in toluene, thereby preparing a conductive ink composition. 20 parts by weight of the copper nano-particles and 1 part by weight of a high molecular weight non-aqueous dispersant (DisperBYK 130) were added to 100 parts by weight of toluene, and then a conductive copper ink composition having a uniform disperse phase was prepared by ball-milling and ultrasonic irradiation. The prepared ink composition was coated on an insulating substrate using a casting method so as to have a thickness of 2 μm after heat-treatment, and heat-treatment was performed thereon at 250° C. under a 5% $H_2$ atmosphere, thereby manufacturing a conductive thin film.

Whether or not a surface oxide film is present on the conductive thin film manufactured as described above and conductivity of the manufactured conductive thin film were measured, and the results were shown in Table 2.

Example 7

73.63 g of octylamine, 25.1 g of oleic acid, 87.4 g of phenylhydrazine, and 10.38 g of copper acetate were mixed, thereby preparing a synthetic solution. A molar ratio of oleic acid to copper acetate was 1.42. After forming an inert gas atmosphere using nitrogen gas, the temperature was raised to 150° C., which is a synthetic temperature, to induce a reduction reaction of copper ions, thereby synthesizing copper nano-particles. The synthesized copper nano-particles were washed and recovered using a centrifugation method, and then finally obtained copper nano-particles were dispersed in toluene, thereby preparing a conductive ink composition. 20 parts by weight of the copper nano-particles and 1 part by weight of a high molecular weight non-aqueous dispersant (DisperBYK 130) were added to 100 parts by weight of toluene, and then a conductive copper ink composition having a uniform disperse phase was prepared by ball-milling and ultrasonic irradiation. The prepared ink composition was coated on an insulating substrate using a casting method so as to have a thickness of 2 μm after heat-treatment, and heat-treatment was performed thereon at 250° C. under a 5% $H_2$ atmosphere, thereby manufacturing a conductive thin film.

Figure 5:
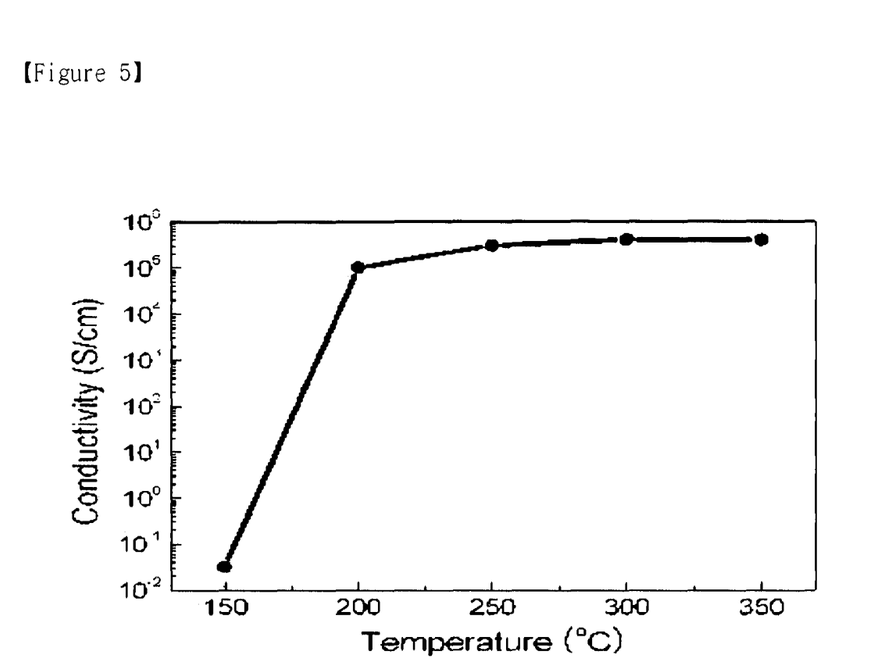
FIG. 5 is a graph showing conductivity of a conductive thin film manufactured in Example 7 according to the heat treatment temperature under hydrogen atmosphere.
Figure 6:
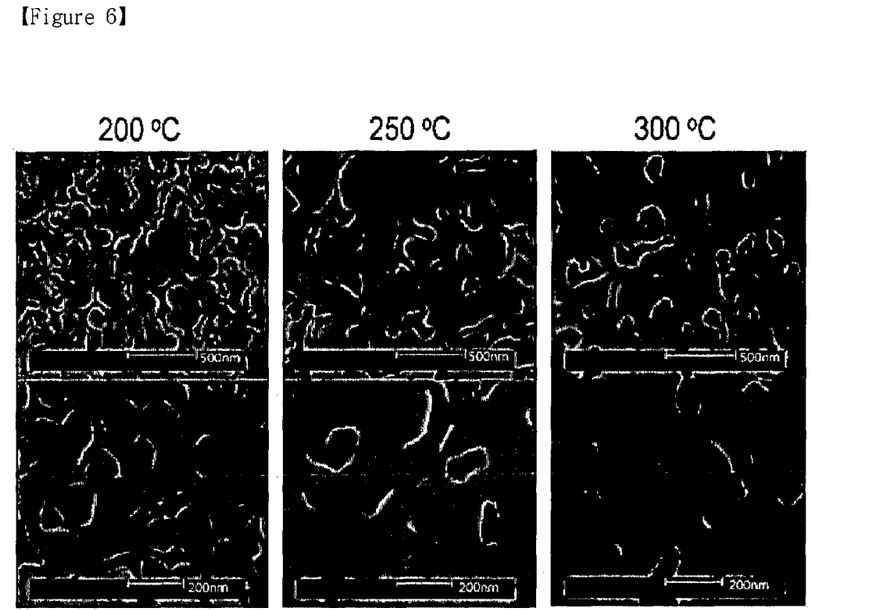
FIG. 6 is a scanning electron microscope (SEM) image of the conductive thin film manufactured in Example 7 according to the heat treatment temperature under hydrogen atmosphere.

Whether or not a surface oxide film is present on the conductive thin film manufactured as described above and conductivity of the conductive thin film were measured, and the results were shown in Table 2 and FIGS. 5 and 6.

Example 8

73.63 g of octylamine, 70.3 g of oleic acid, 87.4 g of phenylhydrazine, and 10.38 g of copper acetate were mixed, thereby preparing a synthetic solution. A molar ratio of oleic acid to copper acetate was 4. After forming an inert gas atmosphere using nitrogen gas, the temperature was raised to 150° C., which is a synthetic temperature, to induce a reduction reaction of copper ions, thereby synthesizing copper nano-particles. The synthesized copper nano-particles were washed and recovered using a centrifugation method, and then finally obtained copper nano-particles were dispersed in toluene, thereby preparing a conductive ink composition. 20 parts by weight of the copper nano-particles and 1 part by weight of a high molecular weight non-aqueous dispersant (DisperBYK 130) were added to 100 parts by weight of toluene, and then a conductive copper ink composition having a uniform disperse phase was prepared by ball-milling and ultrasonic irradiation. The prepared ink composition was coated on an insulating substrate using a casting method so as to have a thickness of 2 μm after heat-treatment, and heat-treatment was performed thereon at 250° C. under 5% $H_2$ atmosphere, thereby manufacturing a conductive thin film.

Whether or not a surface oxide film is present on the conductive thin film manufactured as described above and conductivity of the manufactured conductive thin film were measured, and the results were shown in Table 2.

Example 9

73.63 g of octylamine, 3.52 g of oleic acid, 87.4 g of phenylhydrazine, and 10.38 g of copper acetate were mixed, thereby preparing a synthetic solution. A molar ratio of oleic acid to copper acetate was 0.2. After forming an inert gas atmosphere using nitrogen gas, the temperature was raised to 150° C., which is a synthetic temperature, to induce a reduction reaction of copper ions, thereby synthesizing copper nano-particles. The synthesized copper nano-particles were washed and recovered using a centrifugation method, and then finally obtained copper nano-particles were dispersed in toluene, thereby preparing a conductive ink composition. As a result of analyzing X-ray diffraction (XRD), it was confirmed that copper oxide was not present in the obtained copper nano-particles. 20 parts by weight of the copper nano-particles, 1 part by weight of a high molecular weight non-aqueous dispersant (DisperBYK 130), and 0.1 parts by weight of aminooctylmethylsilane were added to 100 parts by weight of toluene, and then a conductive copper ink composition having a uniform disperse phase was prepared by ball-milling and ultrasonic irradiation. The prepared ink composition was coated on an insulating substrate using a casting method so as to have a thickness of 2 μm after heat-treatment, and heat-treatment was performed thereon at 250° C. under Ar atmosphere, thereby manufacturing a conductive thin film.

Whether or not a surface oxide film is present on the conductive thin film manufactured as described above and conductivity of the manufactured conductive thin film were measured, and the results were shown in Table 1.

Example 10

Figure 7:
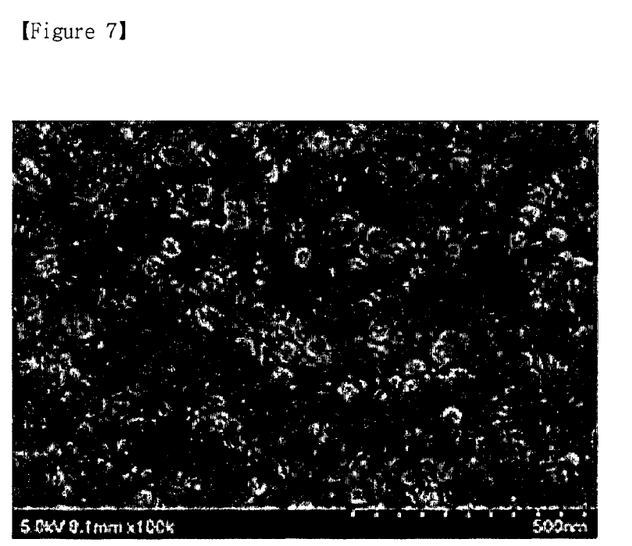
FIG. 7 is an SEM photograph of nickel nano-particles prepared in Example 10.
Figure 8:
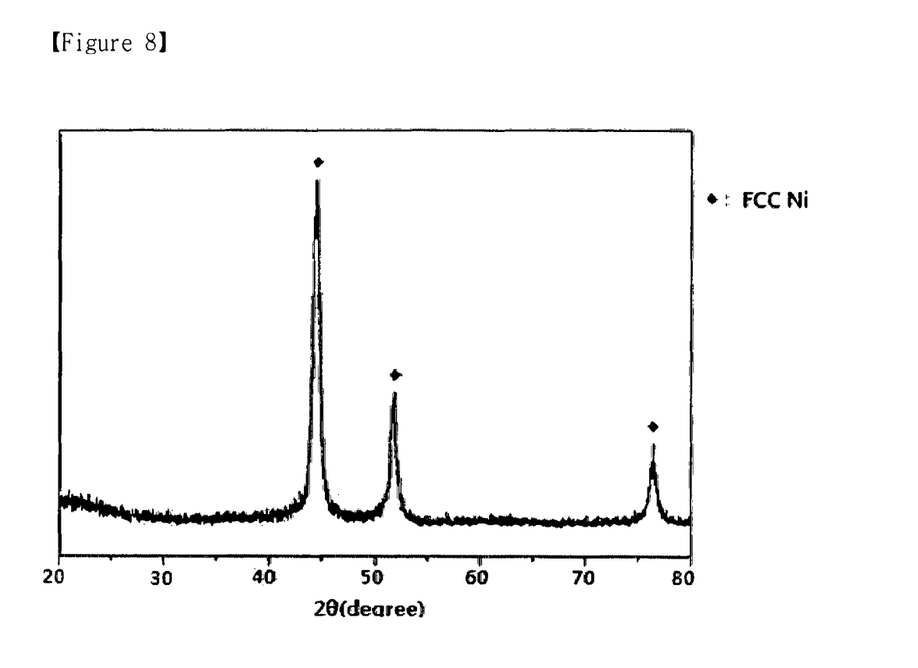
FIG. 8 is an XRD data of the nickel particle prepared in Example 10.

71.84 g of oleamine, 4.23 g of oleic acid, 29 g of phenylhydrazine, and 5 g of nickel acetoacetate were mixed, thereby preparing a synthetic solution. A molar ratio of oleic acid to nickel acetoacetate was 0.73. After forming an inert gas atmosphere using nitrogen gas, the temperature was raised to 240° C., which is a synthetic temperature, to induce a reduction reaction of nickel ions, thereby synthesizing nickel nano-particles. The synthesized nickel nano-particles were washed and recovered using a centrifugation method. As a result, it may be appreciated that the synthesized nickel particles were uniform nickel particles having a size of about 40 nm as shown in FIG. 7 and were pure nickel metal particles in which nickel oxide was not formed as shown in FIG. 8.

Example 11

71.84 g of oleamine, 8.37 g of oleic acid, 29 g of phenylhydrazine, and 5 g of nickel acetoacetate were mixed, thereby preparing a synthetic solution. A molar ratio of oleic acid to nickel acetoacetate was 1.42. After forming an inert gas atmosphere using nitrogen gas, the temperature was raised to 240° C., which is a synthetic temperature, to induce a reduction reaction of nickel ions, thereby synthesizing nickel nano-particles. The synthesized nickel nano-particles were washed and recovered using a centrifugation method. As a result, it was confirm that pure nickel particles having a uniform size of 50 nm were formed, similarly in Example 9.

Comparative Example 1

73.63 g of octylamine, 87.4 g of phenylhydrazine, and 10.38 g of copper acetate were mixed, thereby preparing a synthetic solution. After forming an inert gas atmosphere using nitrogen gas, the temperature was raised to 150° C., which is a synthetic temperature, to induce a reduction reaction of copper ions, thereby synthesizing copper nano-particles. The synthesized copper nano-particles were washed and recovered using a centrifugation method, and then finally obtained copper nano-particles were dispersed in toluene, thereby preparing a conductive ink composition. The large copper nano-particles having a size of 180 nm were obtained. 20 parts by weight of the copper nano-particles and 1 part by weight of a high molecular weight non-aqueous dispersant were added to 100 parts by weight of toluene, and then a conductive copper ink composition having a uniform disperse phase was prepared by ball-milling and ultrasonic irradiation. The prepared ink composition was coated on an insulating substrate using a casting method so as to have a thickness of 2 µm after heat-treatment, and heat-treatment was performed thereon at 250° C. under Ar atmosphere, thereby manufacturing a conductive thin film.

Whether or not a surface oxide film is present on the conductive thin film manufactured as described above and conductivity of the manufactured conductive thin film were measured, and the results were shown in Table 1.

Comparative Example 2

70.3 g of oleic acid, 87.4 g of phenylhydrazine, and 10.38 g of copper acetate were mixed, thereby preparing a synthetic solution. A molar ratio of oleic acid to copper acetate was 6. After forming an inert gas atmosphere using nitrogen gas, the temperature was raised to 150° C., which is a synthetic temperature, to induce a reduction reaction of copper ions, thereby synthesizing copper nano-particles. The synthesized copper nano-particles were washed and recovered using a centrifugation method, and then finally obtained copper nano-particles were dispersed in toluene, thereby preparing a conductive ink composition. 20 parts by weight of the copper nano-particles and 1 part by weight of a high molecular weight non-aqueous dispersant were added to 100 parts by weight of toluene, and then a conductive copper ink composition having a uniform disperse phase was prepared by ball-milling and ultrasonic irradiation. The prepared ink composition was coated on an insulating substrate using a casting method so as to have a thickness of 2 µm after heat-treatment, and heat-treatment was performed thereon at 250° C. under Ar atmosphere, thereby manufacturing a conductive thin film.

Whether or not a surface oxide film is present on the conductive thin film manufactured as described above and conductivity of the manufactured conductive thin film were measured, and the results were shown in Table 1.

TABLE 1

Experimental results of Examples 1 to 4 and 9, and Comparative Examples 1 and 2 (heat treatment atmosphere: Ar)

| | Oleic acid/ Cu acetate molar ratio | Organic amine | Whether or not surface oxide film is present on Cu particles? | Conductivity (s/cm)* |
|---|---|---|---|---|
| Example 1 | 0.2 | used | No | $6 \times 10^2$ |
| Example 2 | 1 | used | No | $6 \times 10^2$ |
| Example 3 | 1.42 | used | No | $6 \times 10^2$ |
| Example 4 | 4 | used | No | $6 \times 10^2$ |
| Comparative Example 1 | 0 | used | Yes | $4 \times 10^2$ |
| Comparative Example 2 | 4 | Not used | Yes | $7 \times 10^2$ |
| Example 9 | 0.2 | used | No | $6 \times 10^2$ |

TABLE 2

Experimental results of Examples 5 to 8 (heat treatment atmosphere: $H_2$)

| | Oleic acid/ Cu acetate molar ratio | Organic amine | Whether or not surface oxide film is present on Cu particles? | Conductivity (s/cm)* |
|---|---|---|---|---|
| Example 5 | 0.2 | used | No | $3 \times 10^5$ |
| Example 6 | 1 | used | No | $3 \times 10^5$ |
| Example 7 | 1.42 | used | No | $3 \times 10^5$ |
| Example 8 | 4 | used | No | $3 \times 10^5$ |

Example 12

Figure 3:
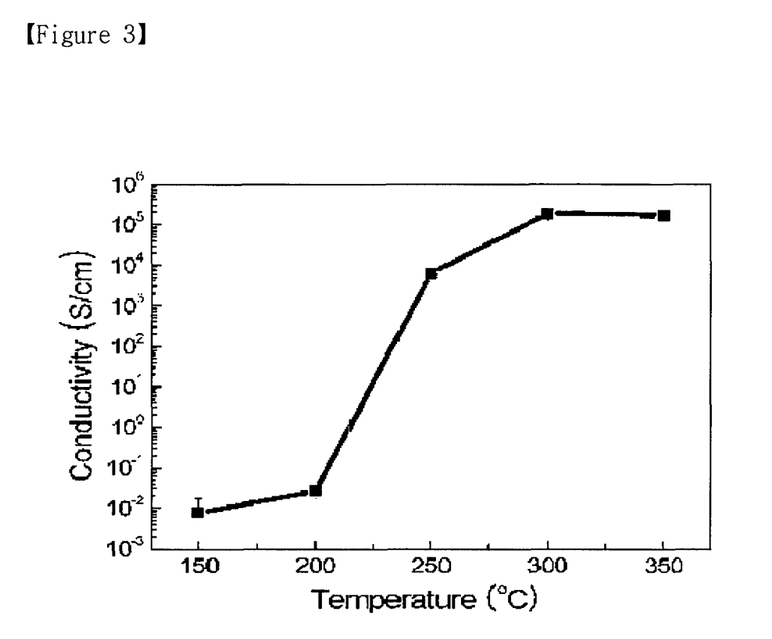
FIG. 3 is a graph showing conductivity of a conductive thin film manufactured in Example 3 according to the heat treatment temperature under inert gas atmosphere.

A conductive metal thin film was manufactured by the same method as in Example 3 except for changing the heat-treatment temperature to 150° C., 200° C., 250° C., 300° C., and 350° C., respectively. Conductivity of the conductive metal thin film manufactured as described above was shown in FIG. 3.

Example 13

A conductive metal thin film was manufactured by the same method as in Example 7 except for changing the heat-treatment temperature to 150° C., 200° C., 250° C., 300° C., and 350° C., respectively. Conductivity of the conductive metal thin film manufactured as described above was shown in FIG. 5.

As confirmed in Table 1, the metal nano-particles capable of suppressing the surface oxide film from being formed and exhibiting excellent conductivity may be synthesized by simultaneously adding acid and amine together with the reducing agent at the time of synthesizing the metal nano-particles. It may be confirmed that when only the amine was added without the acid, even though the reducing agent was added, the oxide film was formed and conductivity of the conductive thin film was decreased. An XRD graph of the copper nano-particles prepared according to the Example 3 of the present invention was shown in FIG. 1. As a result of the XRD analysis, it may be confirmed that the oxide film was not formed. However, in manufacturing the conductive thin film, even trace amount of the oxide film that is not detected by the XRD analysis may increase specific resistance of the conductive thin film.

Therefore, for more accurate analysis, X-ray photoelectron spectroscopy (XPS) analysis was performed, and an XPS graph of the copper nano-particles prepared in Example 3 was shown in FIG. 2. As a result of the XPS analysis, a peak by Cu—O chemical bonds was not observed, and a peak having symmetry by Cu—Cu chemical bonds was observed. Therefore, it may be confirmed that the formation of the oxide film was completely suppressed. The copper nano-particles prepared as described above may exhibit the conductivity through the heat-treatment step.

Example 12 is to measure conductivity according to the heat-treatment temperature under Ar gas atmosphere. As confirmed in the conductivity graph in FIG. 3 and the SEM photograph according to the temperature shown in FIG. 4, conductivity of $6 \times 10^3$ S/cm was obtained at 250° C., and in order to improve conductivity, the heat-treatment at 250° C. or more was required. In addition, Example 12 is to measure conductivity according to the heat-treatment temperature under 5% hydrogen gas atmosphere. It was confirmed through the conductivity graph in FIG. 5 and the SEM photograph according to the temperature in FIG. 6 that excellent conductivity was obtained at a temperature of 200° C. or more. It was confirmed that when the heat-treatment was performed under hydrogen gas atmosphere, conductivity and efficiency were higher as compared with the heat-treatment under argon gas at the same temperature.

The invention claimed is:

1. A method of manufacturing a conductive metal thin film, the method comprising:
   a) preparing a first solution by simultaneously injecting a metal precursor, an organic acid, an organic amine, and a hydrazine based reducing agent;
   b) heating to 150 to 250° C. and stirring the first solution containing the metal precursor, the organic acid, the organic amine, and the hydrazine based reducing agent, and as a solvent, containing only the organic amine to synthesize metal nano-particles on which a surface oxide film is not present;
   c) dispersing the metal nano-particles synthesize in step a) in a non-aqueous solvent to prepare a conductive ink composition;
   d) applying the conductive ink composition onto an insulating substrate; and
   e) heat-treating the insulating substrate applied with the ink composition to form a conductive metal thin film.

2. The method of claim 1, wherein the metal precursor is one or at least two kinds selected from a group consisting of copper, nickel, cobalt, aluminum, and an alloy thereof.

3. The method of claim 1, wherein the acid has at least one shape of a linear shape, a branched shape, and a circular shape in which 6 to 30 carbon atoms are contained and is one or at least two selected from saturated and un-saturated acids.

4. The method of claim 1, wherein a molar ratio of the metal precursor and the acid is 1:0.2 to 4.

5. The method of claim 1, wherein the amine has at least one shape of a linear shape, a branched shape, and a circular shape in which 6 to 30 carbon atoms are contained and is one or at least two selected from saturated and un-saturated amines.

6. The method of claim 1, wherein the reducing agent is one or at least two hydrazine based reducing agents selected from hydrazine, hydrazine anhydride, hydrazine hydrochloride, hydrazine sulfate, hydrazine hydrate, and phenyl hydrazine.

7. The method of claim 1, wherein the non-aqueous solvent in step c) is one or at least two selected from a group consisting of alkane having 6 to 30 carbon atoms, amine, toluene, xylene, chloroform, dichloromethane, tetradecane, octadecene, chlorobenzene, dichlorobenzene, and chlorobenzoic acid.

8. The method of claim 1, wherein the heat-treating in step e) is performed under inert atmosphere or hydrogen atmosphere.

9. The method of claim 1, wherein the conductive ink composition in step c) contains 1 to 20 parts by weight of dispersant based on 100 parts by weight of the metal nano-particles.

10. The method of claim 1, wherein the heating in step b) is performed under inert atmosphere.

11. The method of claim 1, wherein the conductive ink composition contains the following compound at a content of 0.001 to 1 part by weight based on 100 parts by weight of the metal precursor

[Chemical Formula 1]

wherein in Chemical Formula 1, x indicates amine ($-NH_2$) or thiol ($-SH$), $R_1$ indicates ($C_0$-$C_{17}$)alkyl, $R_2$ includes ($C_1$-$C_{17}$)alkyl or ($C_1$-$C_5$) alkoxy, and n is an integer of 1 to 3,

[Chemical Formula 2]

wherein in Chemical Formula 2, $R_1$ includes $CH_3$, $CF_3$, $C_6H_5$, $C_6H_4F$, and $C_6F_5$, $R_2$ includes $(CH_2)_n$, $(CF_2)_n$, and $(C_6H_4)_n$, and n is an integer of 1 to 17.

* * * * *